(12) United States Patent
Jandewerth

(10) Patent No.: US 7,725,284 B2
(45) Date of Patent: May 25, 2010

(54) METHOD AND DEVICE FOR AUTOMATICALLY ESTABLISHING VALUE RANGE LIMITS THAT ARE ASSOCIATED WITH CODE WORDS FOR SAMPLING VALUES

(75) Inventor: Theodor Jandewerth, Recklinghausen (DE)

(73) Assignee: Siemens Aktiengesellschaft, Munich (DE)

( * ) Notice: Subject to any disclaimer, the term of this patent is extended or adjusted under 35 U.S.C. 154(b) by 713 days.

(21) Appl. No.: 11/628,134

(22) PCT Filed: Apr. 20, 2005

(86) PCT No.: PCT/EP2005/051756

§ 371 (c)(1),
(2), (4) Date: Nov. 29, 2006

(87) PCT Pub. No.: WO2005/119917

PCT Pub. Date: Dec. 15, 2005

(65) Prior Publication Data

US 2008/0275663 A1    Nov. 6, 2008

(30) Foreign Application Priority Data

Jun. 3, 2004    (DE) .................. 10 2004 027 146

(51) Int. Cl.
*G01D 1/00* (2006.01)
(52) U.S. Cl. .................................................. 702/127
(58) Field of Classification Search ................. 702/127; 341/156
See application file for complete search history.

(56) References Cited

U.S. PATENT DOCUMENTS

| 4,395,732 | A | 7/1983 | Upton |
| 4,941,152 | A | 7/1990 | Medan |
| 6,498,577 | B1 * | 12/2002 | Lin .............................. 341/156 |
| 2004/0015349 | A1 | 1/2004 | Vinton et al. |

OTHER PUBLICATIONS

M. Nelson; "The Data Compression Book, Passage"; 1996, pp. 17-20, 75-77; XP002338207.

* cited by examiner

*Primary Examiner*—Tung S Lau
*Assistant Examiner*—Xiuquin Sun

(57) ABSTRACT

In one aspect, a method for automatically establishing value range limits for sampling values is provided wherein the value ranges are associated with code words. A total value range for sampling values is divided into source value ranges. Each source value range is assigned a code word in each case. A number of sampling values that lie in a source value range is determined in respect of sampling values of a sampling interval. A limit of a modified value range is established depending on the determined number. A code word is assigned to the modified value range.

17 Claims, 3 Drawing Sheets

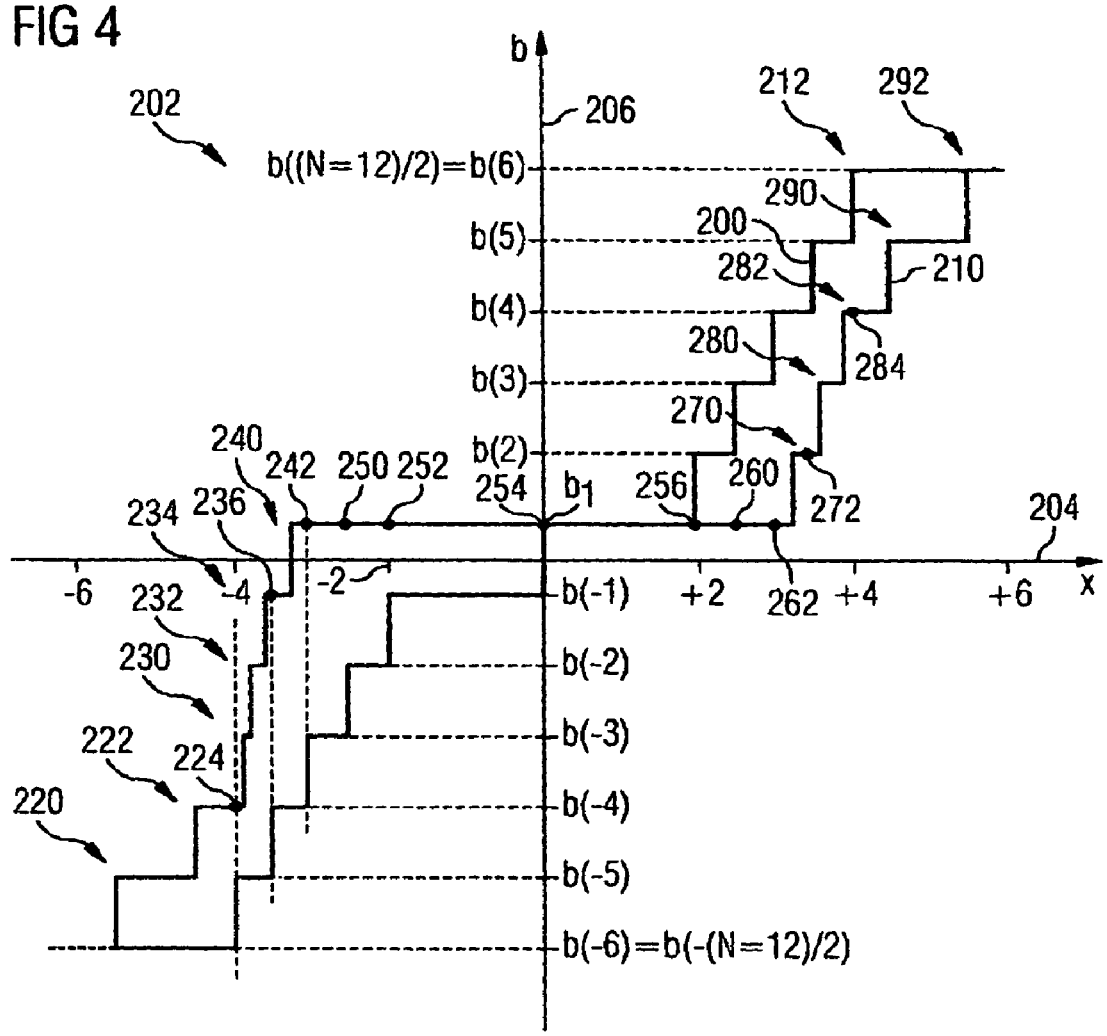

METHOD AND DEVICE FOR AUTOMATICALLY ESTABLISHING VALUE RANGE LIMITS THAT ARE ASSOCIATED WITH CODE WORDS FOR SAMPLING VALUES

CROSS REFERENCE TO RELATED APPLICATIONS

This application is the US National Stage of International Application No. PCT/EP2005/051756, filed Apr. 20, 2005 and claims the benefit thereof. The International Application claims the benefits of German application No. 102004027146.1 DE filed Jun. 3, 2004, both of the applications are incorporated by reference herein in their entirety.

FIELD OF INVENTION

The invention relates to a method in which a total value range for sampling values is divided into source value ranges. Each source value range is assigned a code word in each case.

SUMMARY OF INVENTION

The sampling values are generated, for example, during the timed sampling of a continuous signal, e.g. a voice signal or an image signal. For example, a sampling value of 0.7 volt is generated when sampling a voice signal.

The assignment of source value ranges to code words can be graphically illustrated with the aid of a so-called quantization curve. The quantization curve depicts the relationship between sampling values and quantized values or code words. Since a plurality of sampling values are assigned to an output value or a code word, the quantization curve is stepped. For example, sampling values in the range from 0 volts to 0.2 volt are assigned to a binary code word "0001".

Use is made of linear quantization curves and non-linear quantization curves, wherein smaller quantization errors and therefore smaller disruptions occur when using a non-linear quantization curve in comparison with the use of a linear quantization curve. The intersection point of the quantization curve with the x-axis lies on a horizontal line or on a vertical jump line of the quantization curve.

A quantization based on a non-linear quantization curve can be carried out inter alia as follows:
  using a non-linear quantization curve,
  using a linear quantization curve and a previous non-linear transformation of the sampling values, or
  using a linear quantization with a larger number of quantization levels in comparison with the number of different code words in the subsequent transmission by generating intermediate code words, wherein the code words that must be transmitted are determined from the intermediate code words by means of non-linear binary conversion.

The invention addresses the problem of specifying a simple method for automatically establishing value range limits for sampling values, said value range limits being associated with code words, wherein the method is designed in particular to allow a quantization featuring few quantization errors and little disruption. Provision is also made for specifying a device by means of which, in particular, the claimed method can be carried out.

The invention is based on the idea that previously when selecting the quantization curve, the distribution density of the sampling values has not been adaptively taken into consideration in the case of a linear quantization curve or in the case of a non-linear quantization curve. However, the distribution density of the sampling values is dependent on the time. Moreover, the statistical distribution density can be easily determined and used for an adaptive method.

For example, if most sampling values $x(i)$ are in the range of $-2<x<+2$, where i specifies the sampling time point, this value range should feature small quantization steps. By contrast, the ranges $x<-2$ and $x>+2$ lying outside of this range should be quantized more generously, i.e. the value ranges which are assigned to a code value in these ranges should have range limits which are further removed from each other on a linear number scale than the range limits of value ranges for a code word within the range featuring small quantization steps.

The method may include the following:
  automatically determine the number of sampling values which lie in a source value range in respect of sampling values of a sampling interval, e.g. for all sampling values of this sampling interval or for a representative random sample of this sampling interval,
  automatically establish the limit of a modified value range depending on the determined number, and
  automatically assign a code word to the modified value range.

As a result of this procedure, it is easily possible to achieve an adaptation of the quantization resolution to the statistical distribution of the sampling values over the value ranges or over the code words. The signal-noise ratio is small in the quantization which is based on the quantization curve generated thus. The quantization curve is updated periodically, for example, wherein the period duration is selected depending on the profile of the signal which must be sampled, in particular a constant period duration or a period duration whose value is adaptively adjusted to the signal which must be sampled. Alternatively or additionally, the quantization curve can also be updated depending on the occurrence of predetermined events, e.g. when a voice pause is detected or a change is detected in the tone position of the signal to be transmitted.

In a development, depending on the determined number of sampling values for a source value range, at least one value range limit of a modified value range is established, the value of which limit lies within the source value range. In other words, a horizontal line of the source quantization curve is divided into two or more horizontal lines, said lines being separated from each other in each case by a jump, in order to increase the quantization resolution in a range in which a large number of sampling values occurred during the sampling interval concerned.

In an alternative development, depending on the determined number of sampling values, the whole source value range becomes part of a modified value range which is larger than the source value range and which is assigned to a single code word. In other words, a value range limit of a source value range is removed without in exchange establishing one or more value range limits of modified value ranges. The quantization resolution in the relevant curve section is thus decreased.

In a next development, the method is carried out for all source value ranges such that the whole quantization curve is updated. In this case, an embodiment provides for all source value ranges to be processed in the sequence in which they are arranged in the total value range, e.g. with increasing lower limit values.

In a next development, the number of sampling values in the sampling interval is equal to the number of source value ranges or equal to a whole-number multiple of the number of source value ranges. In the first case, when jumps are inserted, the number of jumps to be inserted corresponds to the number of occurrences of sampling values in the relevant source value range. A jump is removed if no sampling values occurred in a source value range. In the second case, whole-number values can be expected.

In a development, a forced division or a forced combination of modified value ranges is carried out in accordance with a correction specification. Non-uniform quantization is often required specifically for the transmission of voice, in order to keep the signal-noise ratio constant over a large dynamic range. For example, the A-curve or a µ-curve is used in conventional quantization for this purpose. These curves make it possible to quantize small signal amplitudes using more resolution and likewise large signal amplitudes using less resolution. A function which is comparable with these curves can be used in order to ensure that excessively large quantization steps do not occur, particularly in the case of small signal amplitudes. However, it is likewise possible to prevent the non-occurrence of quantization in the case of large signal amplitudes.

The invention also relates to a device for automatically establishing value range limits for sampling values, said value range limits being associated with code words. In particular, the device is suitable for carrying out the claimed method or one of its developments, and therefore the above-cited technical effects also apply to the device.

In a development, the device includes a processor which, when a program is executed, performs the functions of a source assigning unit, a determining unit and an establishing unit. In an alternative development, the device comprises a circuit arrangement which does not include a processor and performs the functions of at least one of the cited units or all of these units. Known circuits for analog/digital converters are modified such that changes to the underlying curve are taken into consideration.

In an embodiment, the updating of the quantization curve is carried out on both the sender side and on a transmission side, wherein the quantized values are transmitted via a transmission link between the sender and the receiver. The changed curve does not have to be transmitted when such a procedure is used.

In an alternative embodiment, by contrast, the changed curve is only determined on the sender side. The changed curve is then sent to the receiver unit together with the data which must be transmitted. As a result of this measure, it is not necessary to calculate a quantization curve on the receiver side.

BRIEF DESCRIPTION OF THE DRAWINGS

Exemplary embodiments of the invention are explained below with reference to the appended drawings, in which:

FIG. 4 shows a source quantization curve and a changed quantization curve which is derived therefrom.

DETAILED DESCRIPTION OF INVENTION

Figure 1:
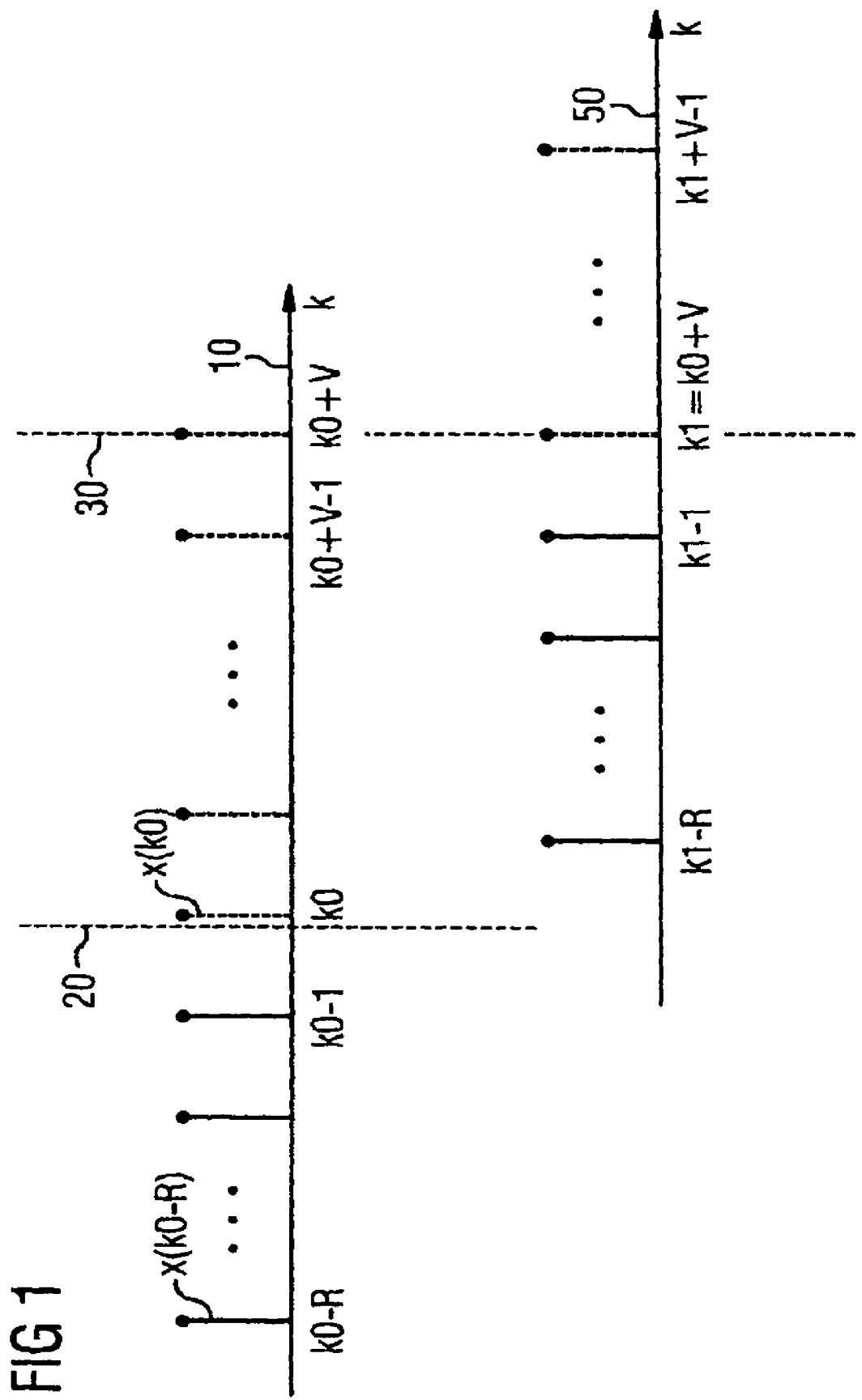
FIG. 1 shows sampling values of a sampling value series from which some of the sampling values are used for changing a quantization curve.

FIG. 1 shows sampling values x(k) which are assigned to a sampling time scale 10, said sampling values x(k) being generated during the sampling of a continuous signal at a constant sampling interval, wherein k is a natural number which specifies a position in the sampling series, in which the sampling values x(k) are arranged in the sequence of their generation, i.e. with increasing sampling times. A position in the sampling series can therefore be assigned exactly to a sampling time point in that, starting from a position having a known sampling time point, the positional difference is multiplied by the sampling interval duration and subtracted from the known sampling time point or added to said time point, depending on whether the position concerned is situated before or after the reference position.

A reference sampling value x(k0) is associated with a position k0, e.g. the position 250. When the reference sampling value x(k0) is processed, the updating of a quantization curve is also carried out; see vertical line 20. When determining the current quantization curve, R sampling values x(k0−R) to x(k0−1) are windowed, said sampling values lying before the reference sampling value x(k0), wherein R is a natural number. If k0 designates the position 250, the sampling values x(238) to x(249) lie within the window assuming R=12.

In order to simplify the explanation, all sampling values x(k) in FIG. 1 are the same size, e.g. because a temporally constant signal is being sampled. However, the sampling values x(k) are usually different from each other because a temporally varying signal is present.

In the exemplary embodiment, the window length R corresponds to the number N of states or code words that can be represented by binary numbers b(j) to be transmitted, wherein j is a whole number for designating a state or code word. For example, a code word b(1) has the value 0001.

The steps which must be carried out in order to change the quantization curve are explained in greater detail below with reference to the FIGS. 2 to 4. The changed quantization curve is used for the transmission of the sampling values x(k0) to x(k0+V), where V is a natural number and in particular greater than 100.

After the transmission of V sampling values x(k), the curve is updated again; see vertical line 30. For example, the curves are updated at intervals in the range of 50 milliseconds to 100 milliseconds. The sampling rate is 8000 per second, for example. A sampling rate scale 50 illustrates the repeated execution of the method in relation to a reference sampling value x(k1) which is identical to the sampling value x(k0+V).

If R=12, for example, the quantization curve is changed anew using the 12 sampling values x(k1−12) to x(k1−1) coming before the sampling value x(k1). The sampling values x(k) to k1+V−1 are then transmitted using the newly changed quantization curve.

Each time the quantization curves are changed, use is initially made of the curve with which the sampling values x(kn−R) to x(kn−1) were quantized, where n is a natural number for specifying the reference position. For example, from left to right the horizontal portions of the quantization curve are examined more closely section by section, wherein each horizontal portion forms a section. The central sections are delimited in each case by two jumps. The number of jumps in each section corresponds to the number of quantized values b(j) that were transmitted. In this case, for example, the steps described with reference to FIGS. 2 and 3 are executed.

Figure 2:
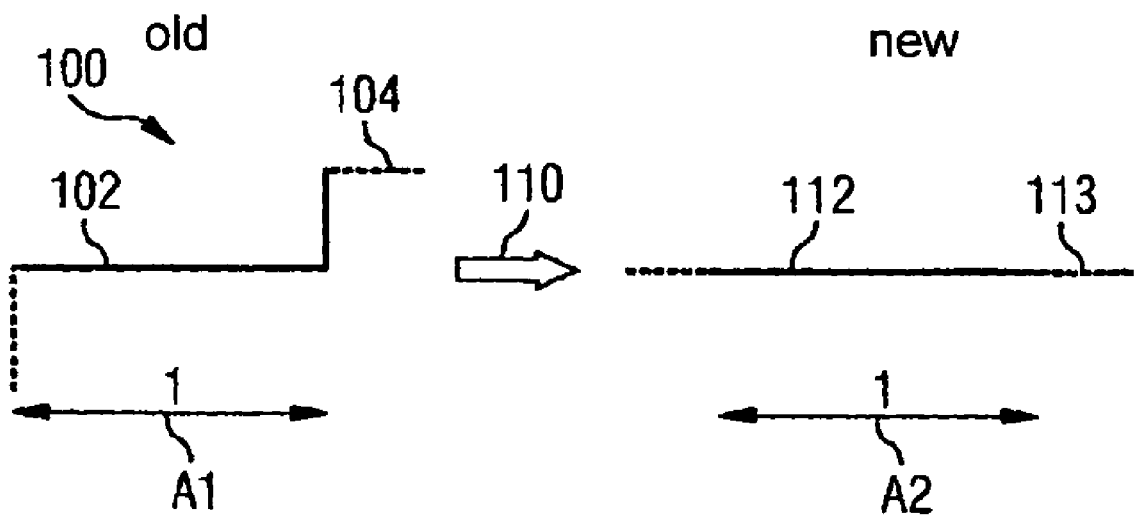
FIG. 2 shows the removal of a quantization jump.

FIG. 2 shows the removal of a quantization jump 100 in relation to a section A1 of a source quantization curve, without a corresponding insertion of a quantization jump in the changed curve. The quantization jump 100 borders on a horizontal line 102 of the section A1 and on a horizontal line 104 of the section to the right of the section A1. The change in the quantization curve is indicated by an arrow 110. There is no longer a jump at the right-hand edge of a section A2 in the changed quantization curve. A horizontal line is formed from the horizontal line 112 and a horizontal line 113 of the section or part section located to the right of the section A2. The sections A1 and A2 have the same length, e.g. a length 1, and are assigned to the same sampling value range relative to the size of the sampling values x(k), e.g. to the same voltage range. A jump is removed if the sampling values which are captured by the windowing do not include a sampling value whose value lies in the range A1.

Figure 3:
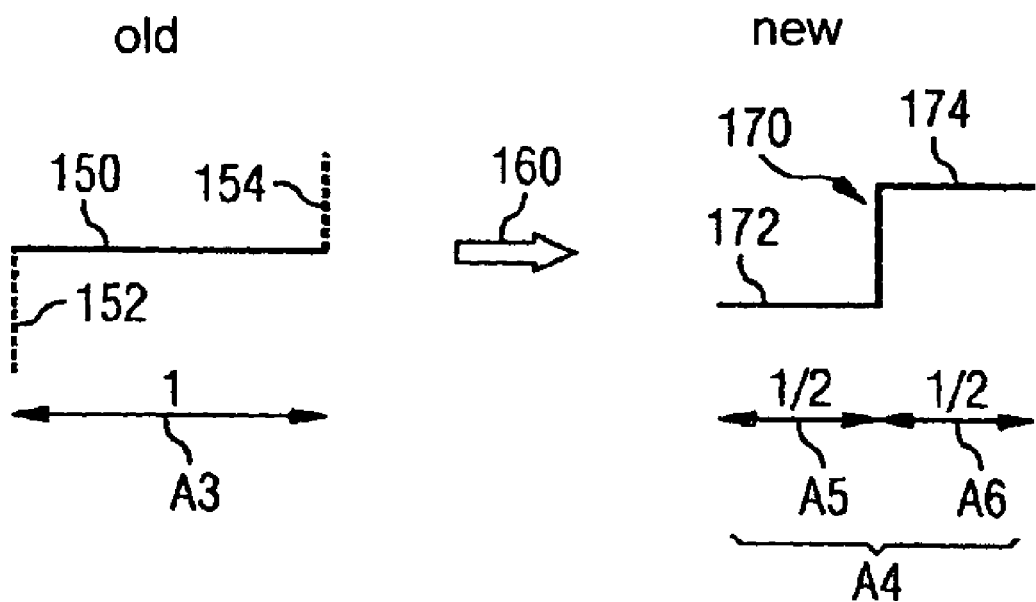
FIG. 3 shows the insertion of a quantization jump.

FIG. 3 shows the insertion of a quantization jump relative to a curve section A3 of a source quantization curve. The source quantization curve has a constant value in the section A3, thus producing a horizontal line 150 which is bordered by a jump 152 at the left-hand end of the section A3 and by a jump 154 at the right-hand end of the section A3. The transformation of the quantization curve is indicated by an arrow 160. A section A4 having the same length as the section A3 and for the same sampling value range is divided into two sections A5 and A6 having identical lengths. A jump 170 is inserted at the border between the section A5 and the section A6, said jump lying between a horizontal line 172 and a horizontal line 174.

The jump 170 forms a step in conjunction with the horizontal line 172 which borders said jump on the left-hand side, wherein the line 172 can be designated as a step base line. Likewise, the jump 170 forms a step in conjunction with the horizontal line 174 which borders said jump on the right-hand side, wherein the line 174 is then designated as a step top line.

In other words, a horizontal line is replaced by a module having the same overall width. The number of values transmitted in the section A3 during the windowing corresponds to the number of steps which must be inserted. If the number of transmitted logical values for b(j) is 2, for example, a jump is inserted at ¼ of the distance from the left-hand edge of the section A4 and a further jump is inserted at ¼ of the distance from the right-hand edge of the section A4, assuming the length of the section A3 was equal to 1. Alternatively, the jumps are arranged at ⅓ of the distance from the left-hand edge of the section A4 and at ⅓ of the distance from the right-hand edge of the section A4.

If the number of transmitted logical values for the code word B(j) is 3, for example, three jumps will be inserted in the range of the horizontal line 150, e.g. at ⅙, ⅗ and ⅚ relative to the left-hand edge of the section A4. Accordingly, given a number n of logical values which must be transmitted for the code word B(j), n jumps are inserted in place of the horizontal line 150, wherein the two outermost jumps are located at 1/n and 1−1/n, for example, and the remaining n−2 jumps are arranged at equal distances between the outermost jumps.

FIG. 4 shows a source quantization curve 200 in a system of coordinates 202 which has a horizontal x-axis 204 and a vertical y-axis 206. The sampling values x in the range from −6 to +6 are dispersed on the x-axis 204. The code words b are dispersed on the y-axis, in particular the code words b(−6) to b(+6). The number of code words in the exemplary embodiment is N=12. The quantization curve 200 and the quantization curves which are derived therefrom, in particular a quantization curve 210, each have N (i.e. 12) quantization levels which are separated by N−1 jumps; see e.g. jump 212.

The quantization curve 200 was used in order to transmit the sampling values x(k0−R) to x(k0−1) at the time points or sampling positions k0−R to k0−1. The curve 200 has the following profile:

$-6 < x \leqq -4$ produces code word b(−6),
$-4 < x \leqq -3.5$ produces code word b(−5),
$-3.5 < x \leqq -3$ produces code word b(−4),
$-3 < x \leqq -2.5$ produces code word b(−3),
$-2.5 < x \leqq -2$ produces code word b(−2),
$-2 < x \leqq 0$ produces code word b(−1),
$-0 < x \leqq +2$ produces code word b(1),
$+2 < x \leqq +2.5$ produces code word b(2),
$+2.5 < x \leqq +3$ produces code word b(3),
$+3 < x \leqq +3.5$ produces code word b(4),
$+3.5 < x \leqq +4$ produces code word b(5),
$+4 < x \leqq +6$ produces code word b(6).

When the sampling values x(k0−R) to x(k0−1) were transmitted at the sampling time points k0−R to k0−1, the following code words should have been transmitted:

b(−5) was transmitted three times,
b(−6), b(6) and b(5) were each transmitted twice,
b(−4) and b(4) were each transmitted once, and
the code words b(−3), b(−2), b(−1), b(1), b(2) and b(3) were not transmitted.

Since the code word b(−6) was transmitted twice, the range $-6 < x \leqq -4$ receives two jumps 220, 222, whereby the quantization curve 210 is established up to a point 224.

The code word b(−5) was transmitted three times and occupied the range $-4 < x \leqq -3.5$. This range receives three jumps 230, 232 and 234 accordingly, whereby the quantization curve 210 is established up to a point 236.

The code word b(−4) was transmitted once and occupied the range $-3.5 < x \leqq -3$. Therefore one jump 240 is inserted in this range, whereby the quantization curve 210 is established up to a point 242.

The logical values b(−3), b(−2), b(−1), b(1), b(2) and b(3) were not transmitted. Therefore no jumps were inserted into the associated ranges $-3 < x \leqq -2.5$; $-2.5 \leqq x \leqq -2$; $-2 \leqq x \leqq 0$; $0 \leqq x \leqq +2$; $+2 \leqq x \leqq +2.5$; $+2.5 \leqq x \leqq +3$; see the profile of the quantization curve 210 from point 242 through points 250, 252, 254, 256 and 260 to a point 262.

The logical value of the code word b(4) was transmitted once. The range $+3 \leqq x \leqq +3.5$ of the quantization curve 200, which range is associated with this code word b(4), therefore receives one jump 270 in the quantization curve 210, whereby the quantization curve 210 is established up to a point 272.

The code word b(5) was transmitted twice. The associated range $+3.5 \leqq x \leqq +4$ therefore receives two jumps 280 and 282 in the changed quantization curve 210, whereby the quantization curve 210 is established up to a point 284.

The logical value b(6) was transmitted twice, and therefore the associated range $+4 \leqq x \leqq +6$ is assigned two jumps 290 and 292. The complete profile of the quantization curve 210 is therefore established.

The jumps 220, 222, 230, 234, 240, 270, 280, 282 and 290 are of equal height, i.e. the lengths of the vertical jump lines (jump lines that are parallel with the y-axis 206) of these jumps are equal to each other. For the transmission of code words or logical values, however, it is not a question of the Euclidean distance between code words but only of their sequence, which is required for the back-transformation. As part of the back-transformation on the receiver side, the code word is assigned a value from the range which is assigned to the code word on the sender side, e.g. the mean value of this range, the lower range limit or the upper range limit.

In another exemplary embodiment, however, rounded physical values are used instead of the logical values or code words. In this case, the position of the jumps and the jump heights are adapted to the value range on the x-axis. In particular, this results in narrow value ranges in a small jump height and wide value ranges in a large jump height. The position of the horizontal line corresponds e.g. to the mean value of the relevant x-axis range. This format is used in particular in the case of purely circuit-based solutions without software components.

The following range limits apply for the quantization curve 210:

$-6 \leq x \leq -5.5$ for the code word b(−6),
$-5.5 \leq x \leq -4.5$ for the code word b(−5),
$-4.5 \leq x \leq -3.9167$ for the code word b(−4),
$-3.9167 \leq x \leq -3.75$ for the code word b(−3),
$-3.75 \leq x \leq -3.583$ for the code word b(−2),
$-3.583 \leq x \leq -3.25$ for the code word b(−1),
$-3.25 \leq x \leq +3.25$ for the code word b(1),
$+3.25 \leq x \leq +3.625$ for the code word b(2),
$+3.625 \leq x \leq +3.875$ for the code word b(3),
$+3.875 \leq x \leq +4.5$ for the code word b(4),
$+4.5 \leq x \leq +5.5$ for the code word b(5), and
$+5.5 \leq x \leq +6$ for the code word b(6).

A non-symmetrical quantization curve 210 is therefore produced from the symmetrical quantization curve 200. Symmetrical quantization curves are an indication of sampling values having the mean value zero.

In an exemplary embodiment, the transformation of the quantization curve 200 into the quantization curve 210 as explained with reference to FIG. 4 is performed with the aid of a processor which executes an instruction sequence of a program. Only the above-specified range limits are stored for each code word. The range limits can be transmitted from a sender to a receiver, for example, such that the described method does not have to be performed in the receiver. Alternatively, the method for transforming the curve 200 into the quantization curve 210 is performed in both a sender and a receiver.

In a further exemplary embodiment, the changed quantization curve 210 is corrected again, e.g. by inserting two forced jumps in the range $-3.25 \leq x \leq +3.25$. In this case, the number of sampling values R in the window is smaller by the value of two in comparison with the number of code words. Otherwise, the method for transforming the quantization curve 200 is performed in the same manner.

In a further exemplary embodiment, the number of transmitted sampling values is weighted for the section concerned in each case. The number captured is therefore increased for ranges which have small amplitude values. The number captured is reduced correspondingly for ranges which have large amplitude values. A scaled A-curve, for example, as known from pulse code modulation could be used for this.

Using the described method, the quantization curve 200, 210 can be partially and dynamically adapted to the sampling values which must be transmitted.

In other exemplary embodiments, the number of quantization levels is greater or smaller than 12, e.g. 256.

The invention can be applied generally in the case of all analog-digital converters and in the case of all digital-analog converters, e.g. in the field of measuring and control technology. In particular, the invention is used both in the context of processing (e.g. compressing) or transmitting voice data, particularly voice data which is generated in the case of telephony, and in the context of transmitting image data. The voice data is transmitted e.g. in circuit switched time slot channels or in data packets, particularly in data packets as per the Internet protocol (IP).

The limits 20 and 30 are positioned such that, for example, code words which are generated for the sampling values lying between these lines are transmitted in the same data packet, wherein preferably only these code words and no other code words are transmitted in the data packet. In particular, the curve adaptation is carried out for each data packet containing code words which are associated with the sampling values of the sampling series.

The invention claimed is:

1. A method for automatically establishing value range limits for sampling values, the value ranges associated with code words, comprising:
    dividing, by a dividing unit, a total value range for the sampling values into source value ranges;
    assigning, by a source assigning unit, each source value range a code word;
    determining, by a determining unit, in respect of sampling values of a sampling interval a number of sampling values that lie in a source value range;
    depending on the determined number establishing, by an establishing unit, a limit of a modified value range; and
    assigning, by the establishing unit, a code word to the modified value range.

2. The method as claimed in claim 1, wherein depending on the determined number, establishing a value range limit of a modified value range, the value of which limit lies within the source value range.

3. The method as claimed in claim 2, wherein the number of value range limits whose value lies within the source value range is proportional to the number of sampling values, and in particular equal to the number of sampling values which were determined for the source value range.

4. The method as claimed in claim 3, wherein depending on the determined number of sampling values the whole source value range becomes part of a modified value range which is larger than the source value range and which is assigned to a single code word.

5. The method as claimed in claim 4, wherein the determined number has the value zero.

6. The method as claimed in claim 1, wherein depending on the determined number of sampling values the whole source value range becomes part of a modified value range which is larger than the source value range and which is assigned to a single code word.

7. The method as claimed in claim 6, wherein the determined number has the value zero.

8. The method as claimed in claim 6, wherein the number of sampling values in the sampling interval is equal to the number of source value ranges.

9. The method as claimed in claim 8, wherein it is performed in the sequence in which the source value ranges are arranged in the total value range.

10. The method as claimed in claim 6, wherein the number of sampling values is equal to a whole-number multiple of the number of source value ranges.

11. The method as claimed in claim 1, wherein it is performed for all source value ranges.

12. The method as claimed in claim 1, wherein the number of sampling values in the sampling interval is equal to the number of source value ranges.

13. The method as claimed in claim 1, wherein the number of sampling values is equal to a whole-number multiple of the number of source value ranges.

14. The method as claimed in claim 1, wherein a forced division or a forced combination of modified value ranges is carried out in accordance with a correction specification.

15. A device for automatically establishing value range limits for sampling values, the value range limits associated with code words, comprising:
    a source assigning unit that assigns a code word in each case to source value ranges of a total value range;
    a determining unit which, in respect of sampling values of a sampling interval, determines a number of sampling values that lie in a source value range; and an establishing unit that establishes a limit of modified value range depending on the determined number, and assigns a code word to the modified value range.

16. The device as claimed in claim 15, further comprises a processor that performs the function of at least one unit when a program is executed.

17. The device as claimed in claim 15, further comprises a circuit arrangement without a processor and performs the function of at least one unit.

* * * * *